US012644177B2

(12) United States Patent (10) Patent No.: US 12,644,177 B2
Arnoult et al. (45) Date of Patent: Jun. 2, 2026

(54) METHOD FOR COATING METAL

(71) Applicant: AGC GLASS EUROPE,
Louvain-la-Neuve (BE)

(72) Inventors: Grégory Arnoult, Noville-les-Bois
(BE); Eric Michel, Uckange (FR)

(73) Assignee: AGC GLASS EUROPE,
Louvain-la-neuve (BE)

( * ) Notice: Subject to any disclaimer, the term of this
patent is extended or adjusted under 35
U.S.C. 154(b) by 717 days.

(21) Appl. No.: 17/414,800

(22) PCT Filed: Dec. 17, 2019

(86) PCT No.: PCT/EP2019/085638
§ 371 (c)(1),
(2) Date: Jun. 16, 2021

(87) PCT Pub. No.: WO2020/127256
PCT Pub. Date: Jun. 25, 2020

(65) Prior Publication Data
US 2022/0018021 A1       Jan. 20, 2022

(30) Foreign Application Priority Data
Dec. 21, 2018     (EP) ..................................... 18215298

(51) Int. Cl.
*C23C 16/40*        (2006.01)
*C23C 16/503*       (2006.01)
*H01J 37/32*        (2006.01)

(52) U.S. Cl.
CPC .......... *C23C 16/401* (2013.01); *C23C 16/503*
(2013.01); *H01J 37/32449* (2013.01); *H01J
37/32596* (2013.01); *H01J 37/32816*
(2013.01); *H01J 2237/3321* (2013.01)

(58) Field of Classification Search
None
See application file for complete search history.

(56) References Cited

U.S. PATENT DOCUMENTS

| | | | | |
|---|---|---|---|---|
| 6,077,567 | A | * | 6/2000 | Boerio .................. C23C 16/511 |
| | | | | 427/579 |
| 8,030,219 | B1 | * | 10/2011 | Kimock ............... H01G 4/1272 |
| | | | | 438/758 |
| 2002/0185199 | A1 | * | 12/2002 | Myers .................... A01N 59/16 |
| | | | | 148/537 |
| 2004/0009676 | A1 | * | 1/2004 | Kim .................. H01L 21/02216 |
| | | | | 438/778 |
| 2008/0267675 | A1 | | 10/2008 | Maehara |
| 2010/0028238 | A1 | | 2/2010 | Maschwitz |
| 2011/0017352 | A1 | * | 1/2011 | Vandermeulen ... G01B 11/0683 |
| | | | | 148/241 |
| 2014/0099451 | A1 | * | 4/2014 | Mahieu ................. C23C 16/402 |
| | | | | 427/579 |
| 2014/0216343 | A1 | | 8/2014 | Maschwitz |
| 2014/0220361 | A1 | | 8/2014 | Maschwitz |
| 2015/0002021 | A1 | | 1/2015 | Maschwitz |
| 2015/0004330 | A1 | | 1/2015 | Maschwitz |
| 2018/0239067 | A1 | * | 8/2018 | Templin .............. G02B 5/0808 |

FOREIGN PATENT DOCUMENTS

| | | | |
|---|---|---|---|
| EP | 1 956 442 A1 | 8/2008 | |
| WO | WO-2016078826 A1 * | 5/2016 | ............. C25D 11/16 |

OTHER PUBLICATIONS

Panasonic, "Production of Aluminum Electrolytic Capacitors", 2014
(as dated by the Wayback Machine), http://industrial.panasonic.com/
www-data/pdf/ABA000/ABA0000TE3.pdf accessed Apr. 29, 2025.
(Year: 2014).*
International Search Report issued on Mar. 23, 2020 in PCT/EP2019/
085638 filed on Dec. 17, 2019.

* cited by examiner

*Primary Examiner* — Kim S. Horger
(74) *Attorney, Agent, or Firm* — Oblon, McClelland,
Maier & Neustadt, L.L.P.

(57)                ABSTRACT
A metal substrate with a silicon oxide based layer having a
thickness between 80 and 400 nm and having between 5 and
30 atom % of carbon. Also included is a process for
depositing by PECVD a silicon oxide based layer, having a
thickness comprised between 80 and 400 nm and comprising
between 5 and 30 atom % of carbon, on a metal substrate.

15 Claims, No Drawings

METHOD FOR COATING METAL

TECHNICAL FIELD

The present invention relates to a silicon oxide based coating for protecting a metal from corrosion as well as to a plasma enhanced chemical vapor deposition method for depositing such a coating on metals. The metal may for instance be any kind of steel. The metal may in particular also be a lightweight metal, for example based on magnesium, aluminium, zinc or titanium.

These metals and their alloys are promising materials for a wide range of applications, in particular where weight reduction is important, such as the automotive and aerospace sectors, in order to lower fuel consumption and reduced $CO_2$ emissions for example. The metal may be anodized or non-anodized aluminium or an anodized or non-anodized aluminium alloy.

BACKGROUND ART

Coatings for protecting metal surfaces from corrosion are numerous. There are paint-based coatings and polymer-based coatings that are easy to apply but offer limited resistance to abrasion. Furthermore, paints cannot be used when a shiny metallic appearance is desired.

Passivation treatments or primer coatings containing chromium compounds to impart corrosion resistance have been much used in the past. Unfortunately, these treatments are toxic and carcinogenic and are to be banned in a large number of countries. Alternative chromium-free surface treatments or coatings such as, laser cladding, thermal spraying, physical vapour deposition, anodizing, conversion coating, and organic coatings have been explored in order to improve the corrosion resistance with limited success. Most often they show low abrasion resistance and limited chemical resistance.

There are sol-gel based coatings that offer the possibility of transparent coatings. The deposition process of these sol-gel based coatings however involves numerous steps, such as priming the metal surface, curing the sol-gel and they are inherently difficult to deposit uniformly on small metal parts.

SUMMARY OF INVENTION

It is an object of the present invention to provide a metal substrate with corrosion protection coating that is highly mechanically and chemically resistant, that is transparent and that can be easily applied in a uniform way on metal parts.

It is another objective of the present invention to obtain deposition of a layer comprising silicon oxide by the use of a low-pressure plasma enhanced chemical vapor deposition (PECVD) process, which pressure is typically between 0.5 and 0.001 Torr, allowing high deposition rates at low temperature and controlling the amount of contaminants, in particular carbon, originating from the precursor. To this end, the operating conditions, in particular regarding the oxygen containing reactive gas, the precursor gas and the plasma power have to be selected in such a way to obtain the desired mechanical and chemical durability.

The inventors have in particular found that the desired mechanical and chemical durability is obtained for a PECVD deposited silicon oxide based corrosion protection layer comprising 2 to 30 at % of carbon and having a thickness comprised between 80 and 400 nm.

The silicon oxide precursor is preferably a hydrocarbon-comprising silicon oxide precursor, such as for example such as TMDSO (tetramethyldisiloxane) and HMDSO (hexamethyldisiloxane) or TEOS (tetra ethoxy silane). As an alternative silane ($SiH_4$) may be used in combination with a carbon source such as $CO_2$, $CH_4$ or $C_2H_4$.

Depending on the PECVD device the range of power to be applied must be expressed in different ways.

In certain embodiments of the present invention at least one linear dual-beam plasma source is used.

In certain other embodiments of the present invention at least one linear hollow cathode plasma source is used. Such a plasma source is for example described in WO2010/017185.

The invention relates, in an embodiment, to a process for the production of a layer comprising silicon oxide on a metal substrate, comprising:

a. taking a low-pressure PECVD device comprising at least one linear dual-beam plasma source, which source comprises at least two electrodes connected to an AC or pulsed DC generator, for the deposition of said layers on the substrate, b. applying an electrical power between the two electrodes, so that the power density of the plasma is between 3 and 17 W per $cm^2$ of plasma, and c. applying, to the substrate, a gaseous carbon-comprising precursor of silicon oxide at a flow rate of between 125 and 750 sccm per linear meter of the plasma source and a reactive gas based on oxygen or on oxygen-comprising derivatives at a flow rate of between 500 and 2500 sccm per linear meter of the plasma source.

The invention relates, in an alternative embodiment to a process for the production of a layer comprising silicon oxide on a metal substrate, comprising:

a. taking a low-pressure PECVD device comprising at least one hollow-cathode plasma source, which source comprises at least one electrode connected to an AC, DC or pulsed DC generator, for the deposition of said layers on the substrate, b. applying an electrical power to the plasma source, so that the power density of the plasma is between 10 and 50 kW per meter of plasma, and, c. applying, to the substrate, a gaseous carbon-comprising precursor of silicon oxide at a flow rate of between 125 and 750 sccm per linear meter of the plasma source and a reactive gas based on oxygen or on oxygen-comprising derivatives at a flow rate of between 500 and 2500 sccm per linear meter of the plasma source.

Stage a) of any process of the present invention requires a low-pressure PECVD device, which pressure is preferably between 0.001 and 0.5 Torr, preferably between 1 and 30 mTorr and more preferably between 3 and 20 mTorr, which device is provided with a linear dual-beam plasma source or with a hollow-cathode plasma source connected to an AC or pulsed DC generator, the frequencies of which are usually between 5 and 150 kHz, preferably between 5 and 100 kHz, or to a DC generator (the latter only in the case of a hollow-cathode source).

PECVD devices comprising a linear dual-beam plasma source which are particularly suitable for the invention are commercially available and can originate, for example, from GPi (General Plasma Inc.—USA). They are linear dual-beam plasma sources connected to an AC or a pulsed DC generator. Alternatively, PECVD devices comprising a plasma source based on a hollow cathode, which is also connected to the abovementioned generators, are also particularly suitable for the invention.

A PECVD device example is described below. The PECVD source is connected to a vacuum chamber. This vacuum chamber is arranged so that it makes it possible to have, next to one another, several PECVD devices or else other sources having different deposition forms. In certain applications, these other sources, which make possible different deposition forms, are flat or rotating cathodes for magnetron sputtering deposition. This type of vacuum chamber or coater may arranged in order to carry out complex depositions of layers on substrates or substrate carriers having large dimensions, for example a metal sheet of 1 to 20 m$^2$.

The vacuum chamber may be part of a horizontal coater or of a vertical coater or of a drum coater or of a barrel coater, and may further comprise a transfer chamber.

The PECVD source used can be composed of a linear dual-beam plasma source comprising two cavities in which discharge takes place and openings from which it is expelled. Each cavity is connected to a pipe which makes it possible to introduce, into the cavity, a gas which will be ionized and includes an electrode connected to a power generator which produces either alternating current (AC) or pulsed DC. The electrode is capable of withstanding at least one magnetron discharge in the cavity. The plasma source includes a series of magnets which face one another and which line the cavity. These magnets are positioned so as to create a magnetic field null point in the cavity where the discharge takes place. As the electrodes of each cavity are connected to the AC generator, alternately, at each half cycle, they are either the anode or the cathode. The gas injected into each cavity is thus ionized; it forms what is known as a plasma source which is emitted out of the source via an opening in the direction of the substrate.

Alternately, the PECVD source used can be composed of a hollow cathode comprising, for example, two cavities forming two electrodes connected to an AC or pulsed DC generator, in which discharge takes place, and openings from where it is expelled. Each cavity is connected to a pipe which makes it possible to introduce, into the cavity, a gas which will be ionized.

The ionizable gas is generally O$_2$ or an O$_2$/Ar mixture for the deposition of oxides. The frequency of the power generator is usually between 5 and 150 kHz, preferably between 5 and 100 kHz. Apart from the plasma source, the precursor gas is injected uniformly along the plasma source. This precursor gas is activated by this plasma. The substrate is taken close to the source and a thin layer is deposited on the substrate from the activated gas. The distance between the substrate surface and the opening of the plasma source, via which the plasma is emitted out of the source, is preferably at least 2 to 20 cm, more preferably at least 4 to 15 cm. The amount of ionizable gas introduced into the cavity is controlled by mass flowmeters which are placed on the pipe between the gas reservoir and the plasma source. The amount of precursor gas injected into the plasma and the flow rate of ions are controlled by a liquid/vapor mass flowmeter. The working pressure range for the plasma source is usually between 1 and 500 mTorr. Pumping is preferably provided by turbomolecular pumps. In order to obtain good uniformity of the deposition on the substrate, pumping upward through the source is preferred.

Preferably, the ratio of the reactive oxygen containing gas flow rate to the gaseous precursor flow rate is at least 3, advantageously between 3 and 50.

The temperature to which the substrate is brought is between 20° C. and 60° C. depending on the residence time of the substrate in the plasma, for instance depending on the speed of displacement of the substrate beneath the plasma source.

The content of carbon in the silicon oxide based layer is preferably determined by photoelectron spectroscopy XPS or by secondary ionization mass spectrometry SIMS; it can also be determined by Raman spectroscopy, by ion beam analysis analytical techniques, such as NRA and RBS, and others.

Preferably, in stage a), the source of the PECVD device has dimensions of between 250 mm and 4000 mm in length and between 100 and 800 mm in width, providing a power of between 5 kW per linear meter of the plasma source and 50 kW, advantageously between 10 and 35 kW per meter of the plasma source.

In stage b), in the case of a linear dual-beam plasma source, a power density is applied between the two electrodes so that the power density is between 3 and 17 W per cm$^2$ of plasma. Below this power density of 3 W per cm$^2$ of plasma, a too high presence of precursor residues is observed and, above 17 W per cm$^2$ of plasma, not enough carbon can be incorporated in the coating.

In stage b), in the case of a hollow-cathode plasma source, a power density is applied between the two electrodes so that the power density is between 10 and 50 kW per meter of plasma, preferably between 12 and 45 kW per meter of plasma. Below this power density of 10 kW per m of plasma, a too high presence of precursor residues is observed and, above 50 kW per m of plasma, indeed even sometimes above 15 kW per m of plasma, not enough carbon can be incorporated in the coating.

The gaseous carbon-comprising precursors of silicon oxide of stage c) are typically TMDSO (1,1,3,3-Tetramethyldisiloxane) and HMDSO (Hexamethyldisiloxane) or TEOS (Tetraethoxysilane), this list not being exhaustive. These precursors are generally organosilicon molecules, alkoxysilanes, comprising both carbon, hydrogen and oxygen next to silicon. As the case may be, stage c) may additionally comprise applying to the substrate an additional precursor, for example in order to include a specific additional oxide such as titanium oxide or zirconium oxide, to further improve mechanical and/or chemical durability and/or to increase the refractive index of the silicon oxide based layer. For the purpose of the present invention the silicon oxide based layer comprises at least 80% by weight of silicon oxide SiO$_2$. The silicon oxide based layer of the present invention may comprise up to about 15% by weight of titanium oxide, zirconium oxide or a mixture thereof.

The flow rate of the gaseous silicon oxide precursor is between 100 and 1000 sccm (standard cubic centimeters per minute) per linear meter of the plasma source, preferably between 150 and 500 sccm or between 200 and 500 sccm per linear meter of the plasma source. This range is necessary in order to obtain high degrees of deposition appropriate to this technique, of the order of 100 to 500 nm·m/min.

The reactive gas is based on oxygen or on oxygen-comprising derivatives, the latter preferably being chosen from the group consisting of ozone, hydrogen peroxide, water and CO$_2$. According to embodiments, the reactive gas can in addition advantageously include an inert gas, such as helium, nitrogen, argon, neon or krypton, in order to promote the chemical dissociation of the precursors and to control the ion bombardment by the source. If present, the proportion of inert gas in the total mixture (reactive gas/inert gas) is defined by the ratio of the flow rate of the reactive gas to the flow rate of the inert gas and is located in the range of 2 to 50, preferably of 10 to 30, very advantageously of 15 to 25. This choice makes it possible to control the coverage of the layer obtained.

The flow rate of the reactive gas is between 500 and 20 000 sccm per linear meter of the plasma source, preferably between 800 and 20 000 sccm or between 1000 and 20 000 sccm per linear meter of the plasma source. Such values have the advantage of ensuring an amount of reactive gas which is sufficiently greater than that of the precursors, making it possible to control the incorporation of carbon in the layer.

The layers are generally manufactured so that their geometric thickness is between 80 and 400 nm, preferably between 90 and 350 nm, in particular between 100 and 300 nm. The chosen thickness depends on the technical effect desired for the substrates thus coated.

The applications of this process are related to the nature of the layer deposited on the substrate. Various embodiments of the invention, for different applications, are described below.

According to a first embodiment, the process is employed for the production of a metal substrate on which is deposited, in direct contact with the substrate, an $SiO_2$ based layer, preventing the corrosion of the metal. The carbon content of this layer should be comprised between 5 atom % and 30 atom %, in order to maximise the corrosion resistance.

The metal substrate may comprise any one or a combination of the following: aluminium; aluminium alloy; magnesium; magnesium alloy; steel; aluminium; stainless steel; zinc or zinc alloy or titanium or titanium alloy. In particular embodiments of the present invention the metal substrate comprises a lightweight metal or metal alloy and particularly those typically used for the aerospace and aviation industries.

In particular embodiments of the present invention, the metal substrate is based on magnesium, aluminium, zinc or titanium, or is based on alloys of magnesium, aluminium, zinc or titanium. In certain particular embodiments, the metal substrate may be anodized by any anodizing process known in the art.

In certain preferred embodiments, for increased mechanical and chemical stability, the anodized metal layer formed by an anodizing process on the metal substrate may have a thickness of at least 5 μm, preferably at least 10 μm, most preferably at least 15 μm. This thickness preferably does not exceed 50 μm, to prevent possible defect formation such as cracks. Due to the porosity of anodization layers particularly good, defect-free coverage is preferred to guarantee corrosion resistance.

In certain embodiments of the present invention, the anodizing step of the metal may be followed by a coloring step and/or a sealing step well known in the art. These colors or seals must be well cured so as not to perturb the PECVD process, by outgassing for example.

In a preferred embodiment of the present invention the metal is preferably an anodized aluminium substrate wherein the aluminium substrate has been anodized according to the process described in EP3245317A1 incorporated by reference herein.

The corrosion resistance is tested according to the corrosion test 9.57448 from Fiat group including test cycle:

a. Immersion for 10 minutes in an acid solution at pH 1 (0.1 molar solution of HCl)

b. Rinsing with running water and drying with compressed air c. Standing in a stove for 1 h±5 minutes at 40° C.±3° C.

d. Immersion for 10 minutes in alkaline solution at pH 13.5 (aqueous solution of 12.7 g/l of NaOH+4.64 g/l Na3PO4)

e. Rinsing with running water and drying with compressed air.

At the end of the total number of test cycles the treated samples are inspected by the naked eye. In order to be deemed corrosion resistant after a certain number of test cycles, there must be no visible change when compared to a non-tested sample.

Furthermore the gloss of the metal substrate may be measured before and after a test cycle. In order to be deemed corrosion resistant the gloss reduction must be not more than 10%, preferably not more than 5%.

Furthermore the metal substrates are heated up to a temperature of 50° C., 100° C., 150° C. or even 200° C. for a duration of 10, 20, 30 or even 60 minutes without the appearance of cracks. In particular they may undergo and pass a second cycle of corrosion test after such a heat treatment.

The inventors surprisingly found that the controlled carbon content of the present invention prevents formation of pinholes by high or low pH solutions and at the same time prevents the creation of cracks upon heating the coated metal substrates.

The silicon oxide based layer may be carried out with a power density of greater than 5 W per $cm^2$ of plasma, for a linear dual-beam plasma source, or of greater than 15 kW per meter of plasma, for a linear hollow-cathode plasma source, the dynamic rate of deposition being less than 500 nm·m/min, preferably between 200 and 500 nm·m/min. The pressures are between 3 and 20 mTorr or in particular between 3 and 15 mTorr. Use is made, as precursor, of an organosilane derivative, such as for example TMDSO, HMDSO or TEOS and, as reactive gas, of an oxygen containing gas, for instance pure oxygen, the ratio of the flow rate of oxygen to the flow rate of the organosilane derivative being greater than 5, preferably greater than 10, indeed even greater than 15. For example the oxygen flow rate may be 1000 sccm for a linear source of 250 mm in length and a flow rate of precursors of 100 sccm.

Addition of an inert gas improves the coverage of the film in particular on the uneven surface of an anodized metal substrate. Well covering films can be obtained by the addition of an inert gas so that the ratio of the flow rate of the reactive gases to the flow rate of the inert gas is at least 3, advantageously between 3 and 50, preferably between 5 and 40.

In an alternative form well covering films can be obtained by modifying the voltage of the cathode, which can be carried out by changing the constituent material of the electrode or by adapting the modules of the power generator or by modifying the pressure. Usually, a voltage of approximately 400 V may be lowered to approximately 340 V, indeed even 300 V. In another alternative form, well covering films may be obtained by increasing the pressure up to values of between 7 and 20 mTorr or between 7 and 15 mTorr, the values of 9-11 mTorr being those which give the best results.

The values cited above for carbon content can in certain embodiments of the present invention be obtained by modifying the voltage of the cathode, which can be carried out by changing the constituent material of the electrode or by adapting the modules of the power generator or by modifying the pressure. Usually, a voltage of approximately 400 V can be lowered to approximately 340 V, indeed even 300 V. In another alternative form, the desired values for carbon content can be obtained by operating in a range of pressures of between 5 and 20 mTorr, preferably between 5 and 15 mTorr, the values of 9-11 mTorr being those which give the best results.

The applicant has shown that, by the use of any of these to processes above, it is possible to obtain silicon oxide comprising layers with a carbon content at most 2 atom %, indeed even of at most 0.5 atom %, and at least 0.1 atom %, indeed even at least 0.2 atom %. The applicant has found that this is only possible by the necessary combination of the PECVD source connected at the generator of stage a), specific power densities of the plasma and when, preferably, the ratio of the flow rate of reactive gas to the flow rate of gaseous precursor is at least that necessary to obtain said layers. By virtue of this controlled content of carbon, the silicon oxide based layer provides the coated metal substrate with a corrosion protection having particularly good chemical and mechanical durability.

The power density of the plasma is defined as being the power dissipated in the plasma generated at the electrode(s), with reference to the size of the plasma.

The "linear meter of the plasma source", also referred to here as "total length of the plasma", is defined as the distance between the ends of the plasma in the direction of the width of the substrate to be coated or the substrate carrier to be treated.

For a linear dual-beam plasma source, the "power density of the plasma" can be defined as the total power applied to the source, divided by the total surface area of the plasma, itself defined as the surface area parallel to the substrate filled with the plasma originating from the plasma source and calculated by multiplying the total length of the plasma by its total width. The "total width of the plasma" is defined as the distance between the ends of the plasma in the direction of forward progression of the substrate to be coated.

For a hollow-cathode plasma source, the "power density of the plasma" can be defined as the total power applied to the source, divided by the total length of the plasma. The present invention is defined in the appended independent claims. Preferred embodiments are defined in the dependent claims.

The present invention further concerns a method for depositing a corrosion protection silicon oxide based coating on a metal substrate.

Linear, Drum, batch or continuous coater, vertical or horizontal.

It is noted that the invention relates to all possible combinations of features recited in the claims.

DESCRIPTION OF EMBODIMENTS

Metal strips of an aluminum were coated with a dual-beam hollow cathode PECVD source having a length of 40 cm.

The precursor used was TMDSO. The metal substrate was transported at a continuous speed on a roller conveyor beneath the PECVD source in a direction transversal to the length of the source. Deposition parameters are given in Table 1 below.

TABLE 1

|  | Power [kW] | Precursor flow rate [sccm] | Pressure [mTorr] | O2 flow rate [sccm] | Substrate speed [m/min] | Number of passes |
|---|---|---|---|---|---|---|
| Ex 1 | 16 | 35.7 | 11 | 1918 | 0.5 | 2 |
| Ex 2 | 16 | 95 | 7 | 1200 | 0.7 | 1 |
| Ex 3 | 5 | 110 | 15 | 2400 | 1.5 | 2 |
| Cex 1 | 5 | 54 | 11 | 1900 | 0.16 | 2 |
| Cex 2 | 16 | 87 | 7 | 1918 | 8 | 2 |
| Cex 3 | 20 | 110 | 15 | 2400 | 2 | 2 |

As can be seen from table 2 below, the resulting coated aluminium strips were subjected to the corrosion test described above and inspected visually. Furthermore the gloss before and after the corrosion test was measured and the difference determined. The coated metal strips were then submitted to heating under air at a temperature of 100° C. for 60 minutes and visually inspected for defects.

TABLE 2

|  | Thickness [nm] | Corrosion visual | Gloss difference | Defects upon heating |
|---|---|---|---|---|
| Ex 1 | 300 | Ok | <5% | No |
| Ex 2 | 280 | Ok | <10% | No |
| Ex 3 | 200 | Ok | <5% | No |
| Cex 1 | 800 | Ok | <5% | Yes |
| Cex 2 | 50 | KO | >10% | No |
| Cex 3 | 200 | KO | >10% | No |

Examples Ex1, Ex2, and Ex3 and counter examples Cex 1, Cex 2 presented a carbon content comprised between 5 and 30 at %. Carbon content can for example be determined by XPS analysis. These samples presented good resistance to corrosion, showing non visible change a less than 10% change in gloss.

Counterexample Cex 3 presented a carbon content of less than 1 at %.

Examples of anodized aluminium were coated in the same way as examples Ex1, Ex2, Ex3 and presented similar results, but furthermore could be exposed to pH 13.5 solution in the corrosion for at least 20 minutes without any visible deterioration.

The invention claimed is:

1. A metal substrate comprising:
a metal sheet comprising aluminum and/or an aluminum alloy;
a silicon oxide based layer having a thickness comprised between 80 and 400 nm and comprising between 5 and 30 atom % of carbon; and
an anodized and subsequently sealed metal layer in between a bulk metal and the silicon oxide based layer, wherein the silicon oxide based layer comprises titanium oxide, zirconium oxide or a mixture of titanium oxide and zirconium oxide in an amount of greater than 0% and up to 15% by weight of the layer.

2. The metal substrate according to claim 1, wherein the silicon oxide based layer comprises at least 80% by weight of $SiO_2$.

3. The metal substrate according to claim 1, wherein a dimension of the metal sheet is between 1 m$^2$ and 20 m$^2$.

4. The metal substrate according to claim 1, wherein the anodized metal layer has a thickness of between 15 and 50 um.

5. The metal substrate according to claim 4, wherein, after heating the substrate to a temperature of 150° C. for 60 minutes, no cracks appear.

6. The metal substrate according to claim 1, wherein the anodized metal layer has a thickness of between 5 and 50 μm.

7. The metal substrate according to claim 1, wherein the anodized layer has a thickness of between 5 and 50 μm and wherein, after heating the substrate to a temperature of 100° C. for 60 minutes, no cracks appear.

8. The metal substrate according to claim 1, wherein there is no visible change after one test cycle when inspected by the naked eye when a corrosion resistance of the coated metal substrate is tested in accordance with Fiat group corrosion test 9.57448.

9. The metal substrate according to claim 1, wherein the silicon oxide based layer is applied by a low-pressure PECVD device comprising at least one linear plasma source having a length of from 250 mm to 4000 mm.

10. The metal substrate according to claim 9, wherein the linear plasma source is a linear hollow-cathode dual-beam plasma source.

10

11. A metal substrate comprising:
a metal sheet;
a silicon oxide based layer having a thickness comprised between 80 and 400 nm and comprising between 5 and 30 atom % of carbon;
wherein the silicon oxide based layer comprises titanium oxide, zirconium oxide or a mixture of titanium oxide and zirconium oxide in an amount of greater than 0% and up to 15% by weight of the layer.

12. The metal substrate according to claim 11, wherein the silicon oxide based layer comprises at least 80% by weight of $SiO_2$.

13. The metal substrate according to claim 11, wherein a dimension of the metal sheet is between 1 $m^2$ and 20 $m^2$.

14. The metal substrate according to claim 11, wherein the metal sheet comprises at least one metal selected from the group consisting of magnesium, aluminum, zinc, titanium, and alloys thereof.

15. The metal substrate according to claim 11, wherein, after heating the substrate to a temperature of 150° C. for 60 minutes, no cracks appear.

* * * * *